US 9,625,516 B2

(12) United States Patent
Hopf et al.

(10) Patent No.: US 9,625,516 B2
(45) Date of Patent: Apr. 18, 2017

(54) DEVICE AND METHOD FOR MONITORING A PHOTOVOLTAIC SYSTEM

(71) Applicant: SMA Solar Technology AG, Niestetal (DE)

(72) Inventors: Markus Hopf, Espenau (DE); Holger Behrends, Kassel (DE); Gerd Bettenwort, Kassel (DE); Sebastian Bieniek, Niestetal (DE); Marcel Kratochvil, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 1146 days.

(21) Appl. No.: 13/729,234

(22) Filed: Dec. 28, 2012

(65) Prior Publication Data

US 2013/0120017 A1 May 16, 2013

Related U.S. Application Data

(63) Continuation of application No. PCT/EP2010/059128, filed on Jun. 28, 2010.

(51) Int. Cl.
*G01R 31/26* (2014.01)
*G08B 13/14* (2006.01)
*H02S 50/10* (2014.01)

(52) U.S. Cl.
CPC ..... *G01R 31/2605* (2013.01); *G08B 13/1409* (2013.01); *H02S 50/10* (2014.12)

(58) Field of Classification Search
CPC .. G01R 31/2605; H02S 50/10; G08B 13/1409
(Continued)

(56) References Cited

U.S. PATENT DOCUMENTS 7,812,592 B2 10/2010 Prior et al.
8,148,849 B2 4/2012 Zanarini et al.
(Continued)

FOREIGN PATENT DOCUMENTS

DE 102006034223 A1 1/2008
DE 102008062659 A1 6/2010
(Continued)

OTHER PUBLICATIONS

International Search Report and Written Opinion of the International Searching Authority dated Apr. 13, 2011 for application No. PCT/EP2010/059128. 12 Pages.
(Continued)

*Primary Examiner* — Farhana Hoque
(74) *Attorney, Agent, or Firm* — Eschweiler & Associates, LLC

(57) ABSTRACT

A device and corresponding method for monitoring a photovoltaic system to detect an occurrence of events impairing normal operation of the photovoltaic system is provide. The photovoltaic system includes a photovoltaic generator including a first group of photovoltaic modules and a second group of photovoltaic modules being different from the first group. The device includes a first and a second pair of coupling means, both pairs including signal coupling-in means for coupling a test signal into the photovoltaic generator, and a signal coupling-out means for coupling out a response signal from the photovoltaic generator, the first pair of coupling means configured to selectively detect the occurrence of the events in the first group of photovoltaic modules, and the second pair of coupling means configured to selectively detect the occurrence of the events in the second group of photovoltaic modules.

16 Claims, 12 Drawing Sheets

(58) Field of Classification Search
USPC .......................... 324/509, 761.01; 340/568.1
See application file for complete search history.

(56) References Cited

U.S. PATENT DOCUMENTS

| | | | |
|---|---|---|---|
| 2008/0106250 A1* | 5/2008 | Prior ....................... | H02S 50/10 |
| | | | 324/76.39 |
| 2010/0007212 A1 | 1/2010 | Zanarini et al. | |
| 2010/0207764 A1* | 8/2010 | Muhlberger ....... | G08B 13/1418 |
| | | | 340/568.1 |
| 2013/0121029 A1* | 5/2013 | Coors .................... | H02J 3/383 |
| | | | 363/13 |

FOREIGN PATENT DOCUMENTS

| | | |
|---|---|---|
| EP | 1918727 A1 | 5/2008 |
| JP | 03-169227 | 7/1991 |
| JP | 2000023365 A | 1/2000 |
| JP | 2010-506413 A | 8/2010 |
| WO | 9525374 A1 | 9/1995 |
| WO | 2008043814 A1 | 4/2008 |
| WO | 2009026602 A1 | 3/2009 |

OTHER PUBLICATIONS

International Preliminary Report on Patentability of the International Bureau of WIPO dated Dec. 28, 2012 for application No. PCT/EP2010/059128. 18 Pages.

\* cited by examiner

DEVICE AND METHOD FOR MONITORING A PHOTOVOLTAIC SYSTEM

FIELD

The disclosure relates to a device and a method for monitoring a photovoltaic system.

BACKGROUND

A photovoltaic system provides electrical energy by means of photovoltaics.

High electric currents can occur during operation of the photovoltaic systems and, in some circumstances, can lead to considerable power losses by interacting with defective and/or damaged components of the photovoltaic system. This relates, in particular, to contact resistances of contacts of connecting points of modules to one another and electrical line connections.

In order to ensure normal operation, it is necessary to monitor photovoltaic systems in order to detect the occurrence of events which impair the normal operation of the device.

By way of example, such events may include theft of one or more components of a photovoltaic system, destruction of one or more components of a photovoltaic system, change in the conductivity of one or more electrical connections of a photovoltaic system (for example contact aging and/or a contact fault), deterioration of the efficiency of one or more photovoltaic modules (degradation), installation faults, for example faulty connection of one or more components during the installation of a photovoltaic system, and/or shadowing, for example shadowing of one or more photovoltaic modules of a photovoltaic system.

The above list of events potentially impairing normal operation of a photovoltaic system does not claim to be complete, and in fact represents an exemplary choice of events impairing normal operation of a photovoltaic system.

SUMMARY

The aim of the present disclosure is to improve the monitoring of the normal operation of a photovoltaic system having two or more photovoltaic modules.

The invention provides a device for monitoring a photovoltaic system to detect the occurrence of events impairing the normal operation of the photovoltaic system. The device comprises a photovoltaic generator having a first group of photovoltaic modules and a second group of photovoltaic modules different from the first group. The device also comprises a first and a second pair of coupling means, both pairs comprising signal coupling-in means for coupling a test signal into the photovoltaic generator and a signal coupling-out means for coupling out a response signal, the first pair of coupling means being arranged to selectively detect the occurrence of the events in the first group of photovoltaic modules, and the second pair of coupling means being arranged to selectively detect the occurrence of the events in the second group of photovoltaic modules.

Each pair of coupling means is used to feed in the test signal and couple out the corresponding response signal to detect an event impairing the normal operation. The division of the photovoltaic generator into the at least two groups and the individual monitoring of the two groups by means of the at least two pairs of coupling means on the one hand allow the impairing event to be located. On the other hand, better scalability results with increasing system size. Using identical components (for example signal coupling-in means, signal coupling-out means), the monitoring device can be adapted to photovoltaic systems of any size by means of subdivision into a corresponding number of groups. Another advantage relates to metrological aspects. The subdivision into groups increases the relative magnitude of that proportion of the response signal assigned to an impairing event. At the same time, the subdivision into groups effectively reduces both interference signals and noise components. The event can therefore be detected in a more reliable manner.

In one advantageous embodiment of the device, the signal coupling-in means of the first pair of coupling means is identical to the signal coupling-in means of the second pair of coupling means. In another advantageous embodiment, the signal coupling-out means of the first pair of coupling means is identical to the signal coupling-out means of the second pair of coupling means. In this manner, the device can be implemented with reduced use of materials while retaining said advantages, in particular the locatability and the scalability.

The disclosure also provides a method of monitoring a photovoltaic system with a number of at least two or more photovoltaic modules to detect the occurrence of events impairing the normal operation of the photovoltaic system. The photovoltaic system is excited with at least one electrical test signal coupled into the photovoltaic system using at least one coupling-in means. At least one excitation response signal from the photovoltaic system is coupled out of the photovoltaic system using at least one coupling-out means, and evaluated to detect the occurrence of at least one event impairing the normal operation of the photovoltaic system. The at least two or more photovoltaic modules are divided into at least two or more groups, wherein each of the groups are monitored for the occurrence of an event impairing the normal operation of the photovoltaic system.

The disclosure improves the monitoring of a photovoltaic system, with two or more photovoltaic modules by enabling the localized detection of one or more events impairing the normal operation of the photovoltaic system in accordance with the list mentioned at the outset. Such an event or such a fault can therefore be located in a more accurate manner than when the overall system is monitored without subdivision into groups. This advantageously makes it possible to extensively monitor photovoltaic systems. The guarantee of normal operation of such systems and the associated reliable provision of electrical energy are considerably simplified.

It is advantageous to carry out one or both the excitation and the excitation response separately for each group. If both of steps 100 are carried out separately for each group, the monitoring is particularly precise. In contrast, the two alternative embodiments reduce the circuitry complexity.

The disclosure is described in more detail below using example embodiments and with reference to the accompanying drawings.

Before embodiments are described, it is noted that some embodiments are also described in detail below, but the disclosure is not restricted to these embodiments, but can be varied in any desired manner within the scope of the claims. In particular, terms such as "at the top", "at the bottom", "at the front", or "at the rear" should not be understood to be restrictive but only relate to the arrangement illustrated in each case. In addition, if individual components are explained, multiple embodiments of these components are also conceivable in principle, unless otherwise mentioned. In addition, functional reversals of the arrangements and methods illustrated and equivalent embodiments also fall under the scope of protection.

DETAILED DESCRIPTION

Figure 1:
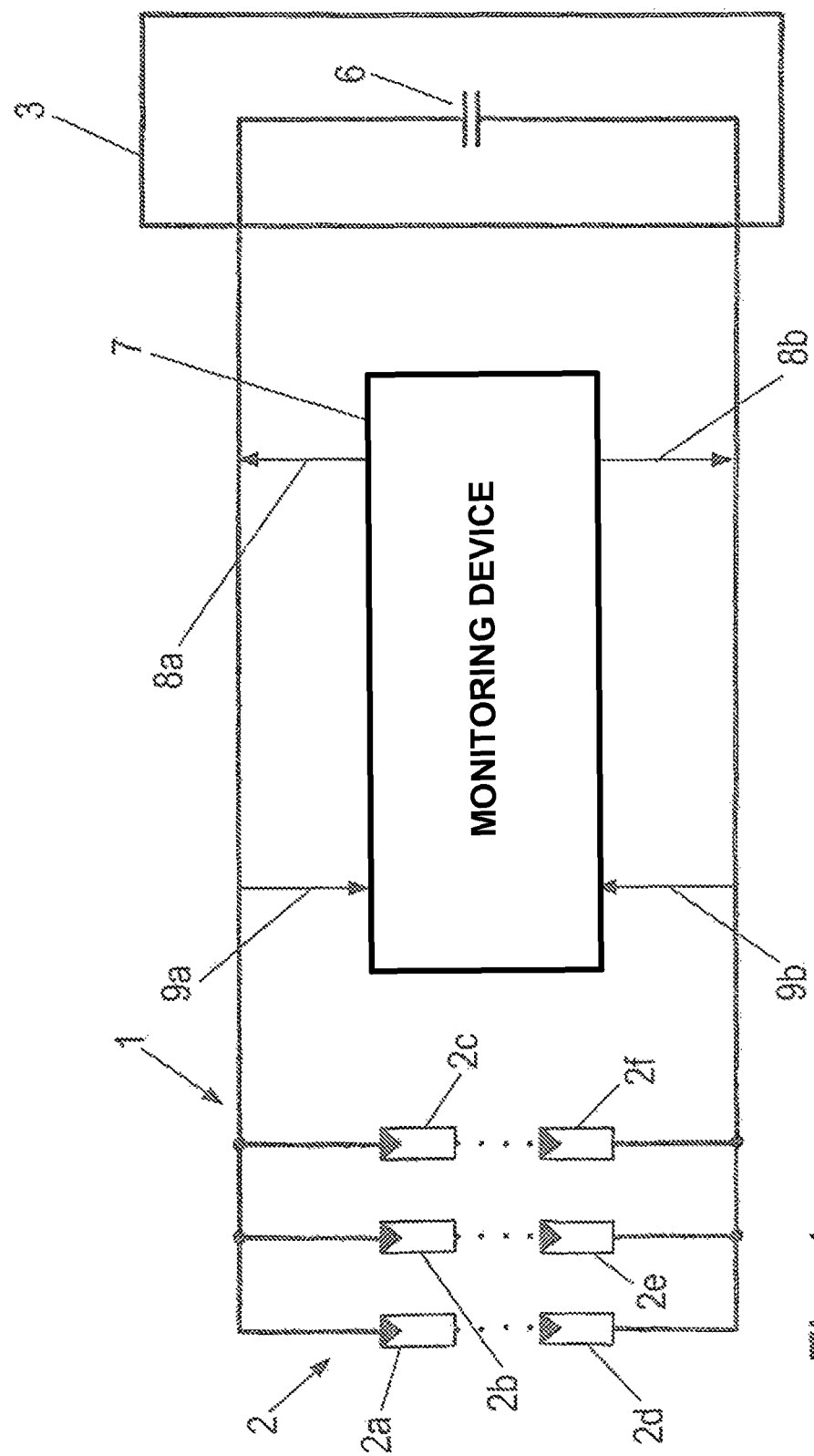
FIG. 1 shows a schematic illustration of a photovoltaic system to be monitored in the form of a block diagram.

FIG. 1 shows, by way of example, a photovoltaic system 1 in the form of an electrical circuit diagram. The photovoltaic system 1 comprises a photovoltaic generator 2 with a number of photovoltaic modules 2a to 2f.

Within the scope of this disclosure, that part of the photovoltaic system 1 converting radiation energy into electrical energy is referred to as the photovoltaic generator 2. A photovoltaic generator 2 may comprise only a single photovoltaic module up to a very large number of photovoltaic modules 2a-2f. These photovoltaic modules 2a-2f may be connected and/or arranged in a wide variety of ways inside the photovoltaic generator 2. By way of example, a plurality of photovoltaic modules are respectively connected in series to form a so-called string in the example embodiment in FIG. 1, only two photovoltaic modules 2a and 2d, 2b and 2e and 2c and 2f respectively being illustrated for each string for the sake of clarity. A total of three strings connected in parallel constitute the photovoltaic generator 2.

The photovoltaic system 1 further comprises at least one inverter 3 which converts and/or preprocesses an electrical power provided by the photovoltaic generator 2 via electrical lines, such that the converted and/or preprocessed electrical power can be fed into an electrical system (not illustrated), for example the public power supply system.

A capacitance 6 symbolizes the AC behavior of the inverter 3 for higher-frequency AC voltages.

A monitoring device (for example a signal generator and signal processing device provided with the required means and comprising a control device) denoted by the reference symbol 7 is designed to excite the photovoltaic system 1 with at least one test signal via electrical connections as coupling-in paths 8a, 8b and coupling-out paths 9a, 9b (of an electrical and/or non-electrical type)—illustrated symbolically as lines.

The monitoring device 7 is also configured to record at least one excitation response signal from the photovoltaic system 1 responsive to the excitation with the at least one test signal.

In addition, the monitoring device 7 is also configured to evaluate this excitation response signal. It may thus be configured to use the excitation response signal to detect the occurrence of at least one event (cf. above) impairing the normal operation of the photovoltaic system 1 in order to output an alarm signal, for example, if operation has been disrupted.

For example, a faulty contact can be detected with the aid of a test signal at a variable frequency coupled into the electrical equipment of the photovoltaic system and coupled out from the latter again in the form of an excitation response signal, without having to break the electrical connections of the photovoltaic system. For this purpose, the behavior of the photovoltaic system is recorded over a certain period, for example, and suitable parameters which characterize "normal operation" without faults are stored.

Deviations from the determined parameters indicate possible fault states. A parameter of this type may be, for example, the impedance behavior of the system.

Figure 10:
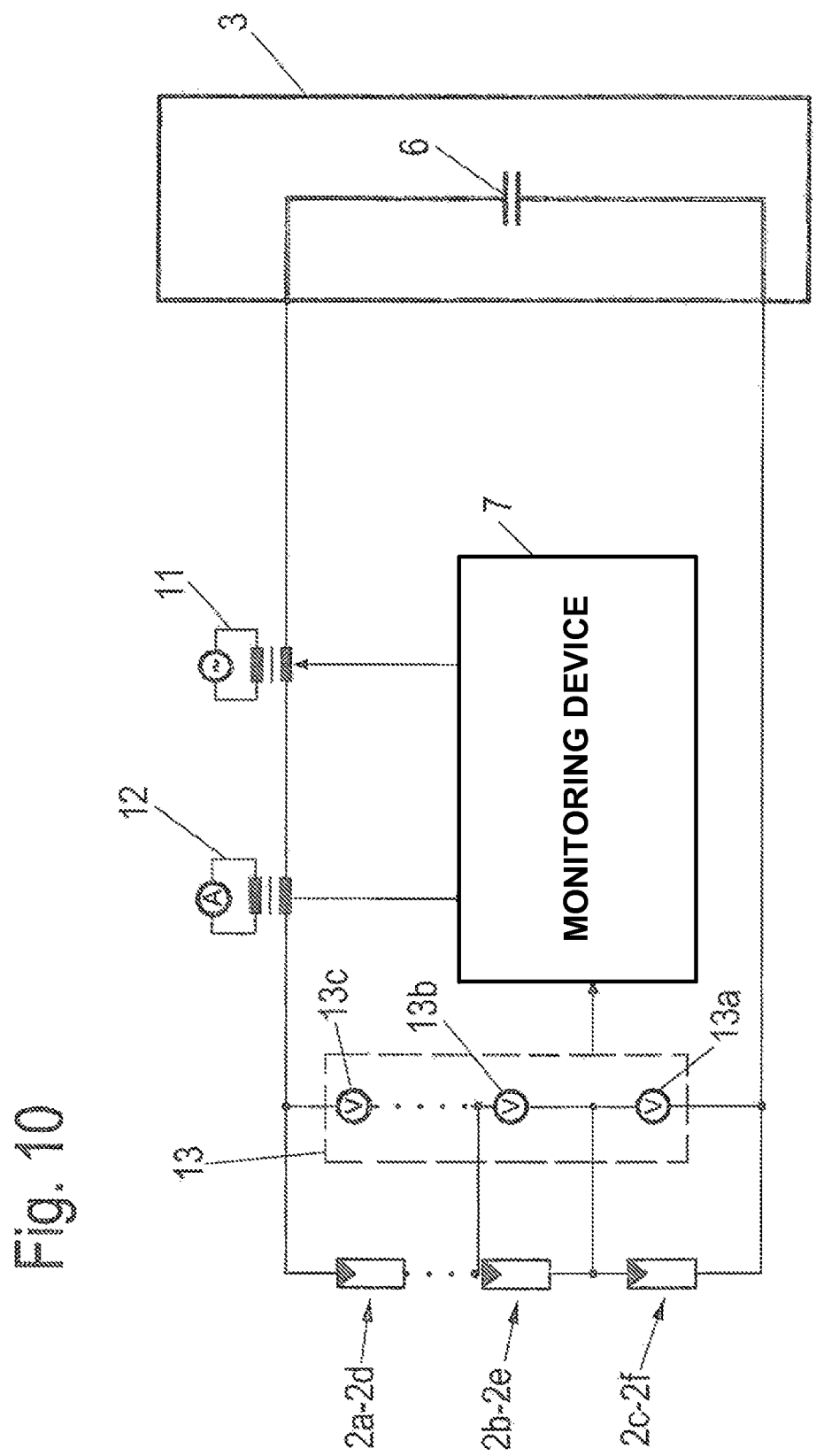
FIG. 10 shows a ninth embodiment of the disclosure in the form of a simplified electrical circuit diagram.
Figure 11:
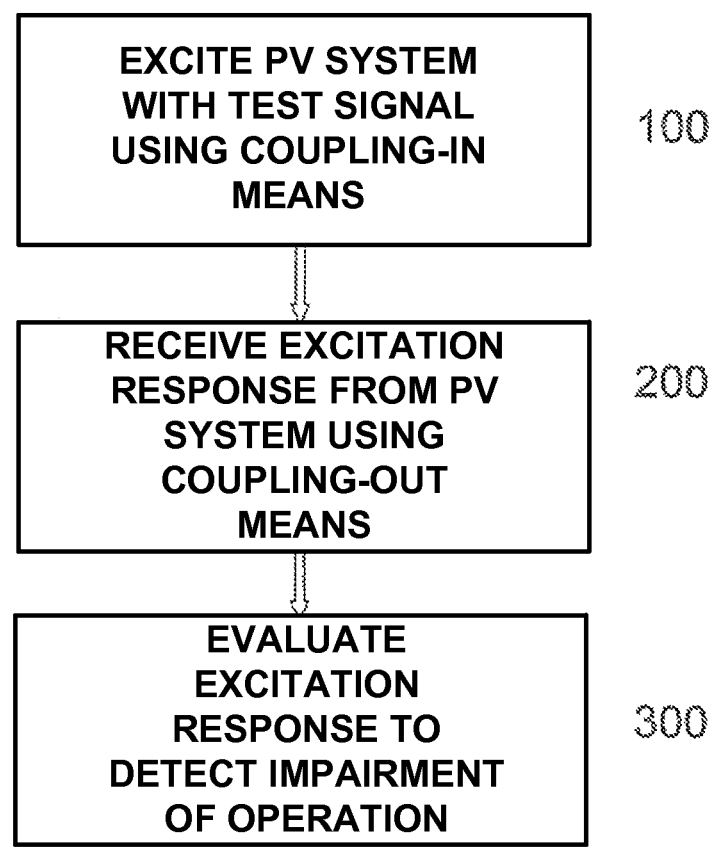
FIG. 11 shows a flowchart for illustrating a monitoring method.

As illustrated in a simplified manner in FIG. 11, the photovoltaic system 1 is excited with at least one electrical test signal coupled into the photovoltaic system 1 using at least one coupling-in means 11 (see FIGS. 2, 3, 4, 8, 10); 15, 17 (see FIGS. 5, 6, 7) and 20 (see FIG. 9) at 100. At least one excitation response signal from the photovoltaic system 1 responsive to the excitation being is coupled out from the photovoltaic system 1 at 200 using at least coupling-out means 12 (see FIGS. 4 to 7, 9, 10) and 19 (see FIG. 8), and the excitation response signal from the photovoltaic system 1 is evaluated at 300 to detect the occurrence of at least one event impairing the normal operation of the photovoltaic system 1—step 300.

Fault states in a photovoltaic system can be determined in this manner using a single signal coupling-in means and corresponding single coupling-out and evaluation means. Some example embodiments are also used below to describe how this method can be used to not only generally ascertain but also to be able to more precisely locate fault states within the photovoltaic generator.

In this case, the photovoltaic modules 2a to 2f of a photovoltaic generator 2 are divided into at least two or more groups, and more than one, in one embodiment all, of these groups are separately monitored for the occurrence of an event impairing the normal operation of the photovoltaic system 1. In this case, it is clear that the occurrence of such an event in one of the groups being monitored may influence the normal operation of the overall photovoltaic system 1.

A first advantage of the disclosure is the good scalability of the means required to carry out the disclosure, that is to say said means can be adapted to photovoltaic generators of any desired size. Another advantage is the possibility of being able to locate the occurrence of the impairing events inside the photovoltaic generator. Furthermore, the influence of an impairing event is proportionately greater considering the smaller current flow inside a group (in comparison with the total current). As a result of the subdivision into groups, the relative proportions of both interference signals and noise components are reduced. The event can thus be detected in a more reliable manner.

At the same time, the requirement for a minimized influence on the operation of the photovoltaic device can be met by the method according to the disclosure.

Further advantages become obvious based on the following explanation of the disclosure.

Figure 2:
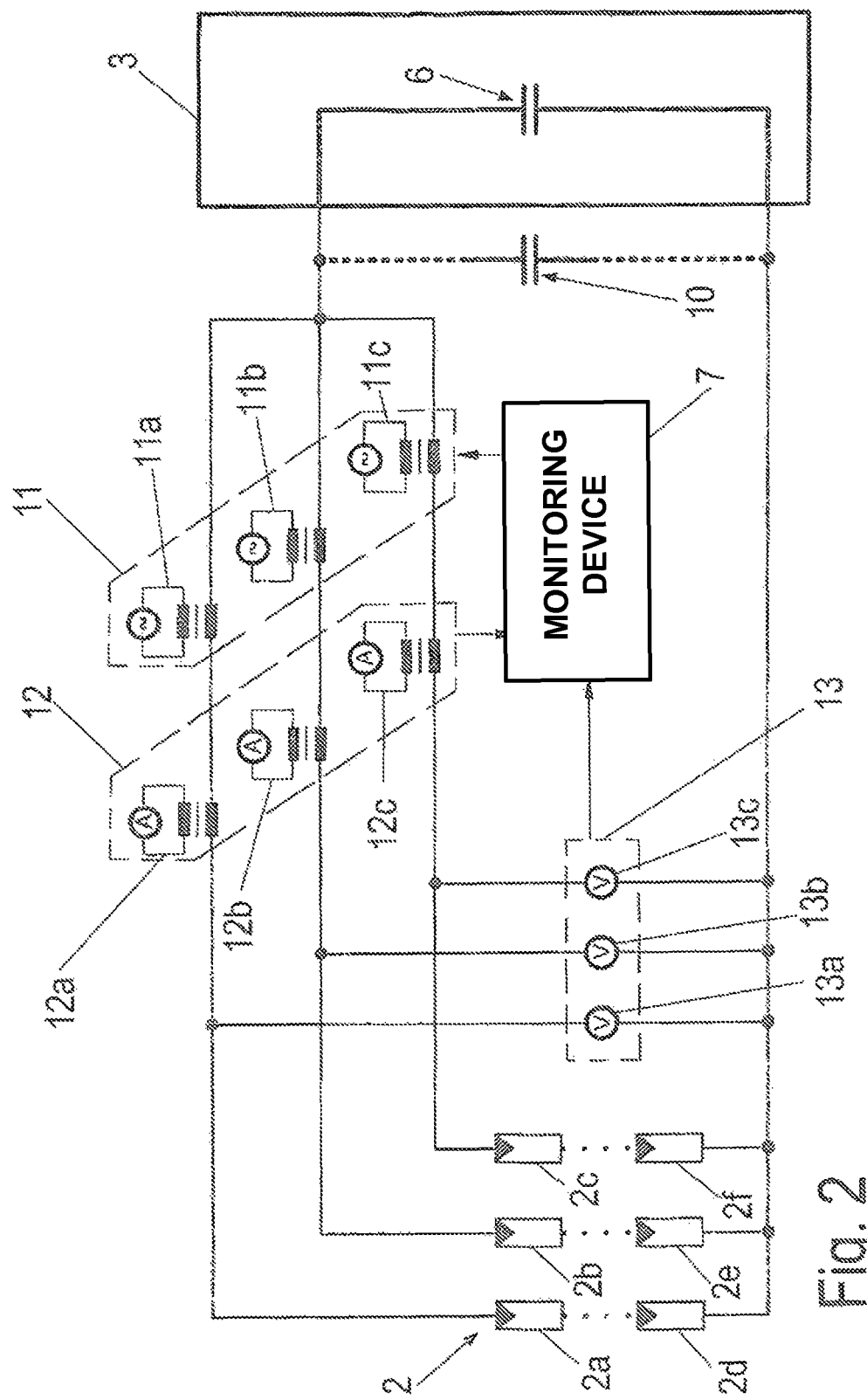
FIG. 2 shows a first embodiment of the disclosure in the form of a simplified electrical circuit diagram.

FIG. 2 shows, by way of example, a first embodiment of the disclosure illustrated in more detail.

A photovoltaic generator 2 is shown again, two illustrated photovoltaic modules 2a and 2d, 2b and 2e and 2c and 2f respectively being combined to form a string, as in the example embodiment in FIG. 1.

The inverter 3 and its AC equivalent capacitance 6 are also shown. Also illustrated is a further capacitance 10 which is connected in an operating mode in which the inverter 3 is not operating (for example at night) and its AC equivalent capacitance 6 therefore is not used to ensure a closed circuit in terms of alternating current.

A pair of coupling means that can be used to detect the occurrence of events impairing the normal operation within a string is respectively assigned to each of the three strings formed from the photovoltaic modules 2a and 2d, 2b and 2e and 2c and 2f. The photovoltaic generator 2 is thus subdivided into different groups within which said events can be selectively detected. In this sense, within the scope of the disclosure, a group can be understood as referring to an arrangement of photovoltaic modules 2a-2f, to which a pair of coupling means for detecting the impairing events is assigned. In this case, the connection of the photovoltaic modules in a group to one another is arbitrary and is not restricted to a series circuit, like in the example embodiment in FIG. 2.

A pair of coupling means comprises coupling-in means 11—for example a transformer 11a, 11b, 11c—for coupling a test signal into the respective group, here accordingly the respective string. The coupling-in means 11 comprises in one embodiment non-saturating components, with the result that monitoring can also be carried out when high direct currents flow between the photovoltaic generator 2 and the inverter 3. A single coupling-in means 11 or each coupling-in means 11 may comprise a signal generator with a controllable source for generating a test signal at variable frequency.

Each pair of coupling means also comprises signal coupling-out means 12 for recording a response signal. Current transformers 12 for determining a current as part of the signal response from the strings to the excitation with the test signal, for example current transformers 12a, 12b, 12c, are provided, on the one hand, as signal coupling-out means.

The current transformers 12 for detecting the current have non-saturating components in one embodiment, with the result that monitoring can also be carried out when high direct currents flow between the photovoltaic generator 2 and the inverter 3.

On the other hand, in one embodiment a voltage measuring device 13, for detecting a voltage as part of the excitation response signal from the string responsive to the excitation with the test signal, for example voltmeters 13a, 13b, 13c, is assigned to each string 2a and 2d, 2b and 2e and 2c and 2f as a further part of the signal coupling-out means. In one embodiment the voltmeters 13a, 13b, 13c have a high impedance in order to minimize influence on the function of the photovoltaic system 1 or influence on a further coupling-in or coupling-out device.

The circuit arrangement shown also ensures that the—in this embodiment a number of three—illustrated measuring circuits of the strings 2a and 2d, 2b and 2e and 2c and 2f influence one another as little as possible. This is achieved by the inductances of the respective other measuring circuits acting as blocking inductances. For example, the inductances of the coupling-in means 11a and of the coupling-out means 12a prevent an interfering current flow via the string 2a and 2d from forming as a result of a test signal coupled in via the coupling-in means 11b. Instead, such an alternating current flows via the capacitance 10 or 6, via the string 2b and 2e and via the coupling means 12b and 11b.

Evaluation is carried out using a control device of the monitoring device denoted overall in FIG. 1 with the reference symbol 7 interacting with the devices 11, 12 and 13 in FIG. 2.

The arrangement described entails the particular advantage that each string (that is to say each group) can be monitored separately. It is thus possible to detect in which string of a number of strings an event impairing the normal operation of the photovoltaic system 1 has occurred. This localization of the event obviates the often time-consuming search for the relevant string.

Figure 12:
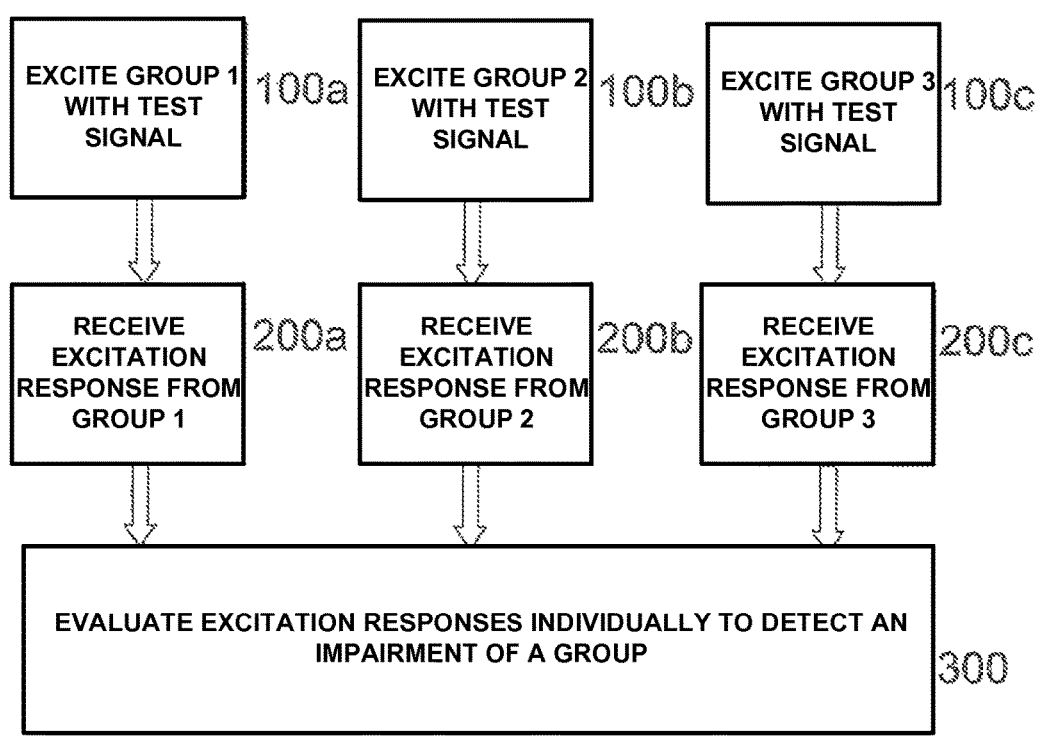
FIG. 12 shows another flowchart for illustrating a monitoring method according to the disclosure.

As illustrated in FIG. 12, the at least two or more photovoltaic modules are subdivided in this manner into at least two or more groups, each of the groups being monitored for the occurrence of an the normal operation of the photovoltaic system 1.

For this purpose, according to FIG. 2, each of the groups is separately excited with at least one electrical test signal which is coupled into the photovoltaic system 1 using at least one coupling-in means 11 at 100a, 100b and 100c, respectively. At least one excitation response signal from the photovoltaic system 1 is separately coupled out from the photovoltaic system 1 for each group using at least one coupling-out means 12, 13 at 200a, 200b and 200c, respectively, and the respective response signal from the photovoltaic system 1 is evaluated to detect the occurrence of at least one event impairing the normal operation of the photovoltaic system 1 at 300.

According to FIGS. 2 and 12, both steps 100 and 200 are each carried out separately for each of the groups (100a, 100b, 100c; 200a, 200b, 200c). Evaluation can be carried out in only one act 300 or in a plurality of acts 300 by means of a superordinate control device.

It becomes clear below that there are alternatives to this procedure within the scope of the disclosure, a few of which are intended to be considered in more detail without the subsequent list of examples having to be considered to be completed. In particular, it is possible to carry out at 100—the coupling-in of the test signal—or at 200—the coupling-out of the response signal—only once for the entire photovoltaic system, rather than for each group, and to carry out only the respective other step 100 or 200 for each group.

Figure 3:
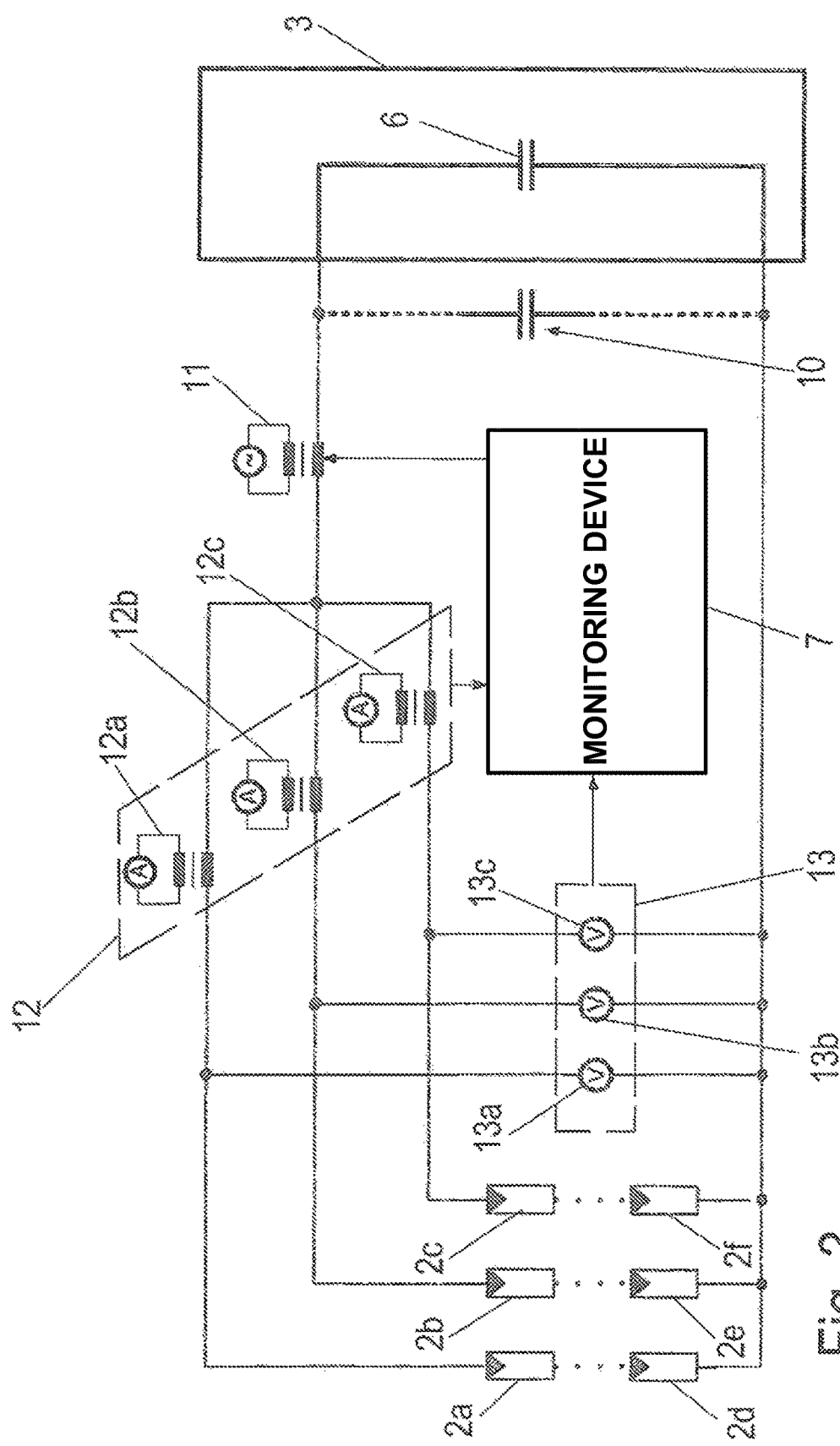
FIG. 3 shows a second embodiment of the disclosure in the form of a simplified electrical circuit diagram.

FIG. 3 shows an arrangement corresponding to FIG. 2 with the difference that one transformer 11 is provided here for a number of, for example, three strings 2a, 2d and 2b, 2e and 2c, 2f (that is to say for three groups) as a common coupling-in means. The coupling-in means is thus identical for all pairs of coupling means, whereas the current transformers 12a, 12b, 12c and the voltmeters 13a, 13b, 13c are configured separately as coupling-out means for the three groups. Act 100 (cf. FIGS. 11 and 12) is thus carried out only once for the entire system. The outlay on hardware is reduced in comparison with the embodiment in FIG. 2 but it is nevertheless possible to locate the event.

Figure 4:
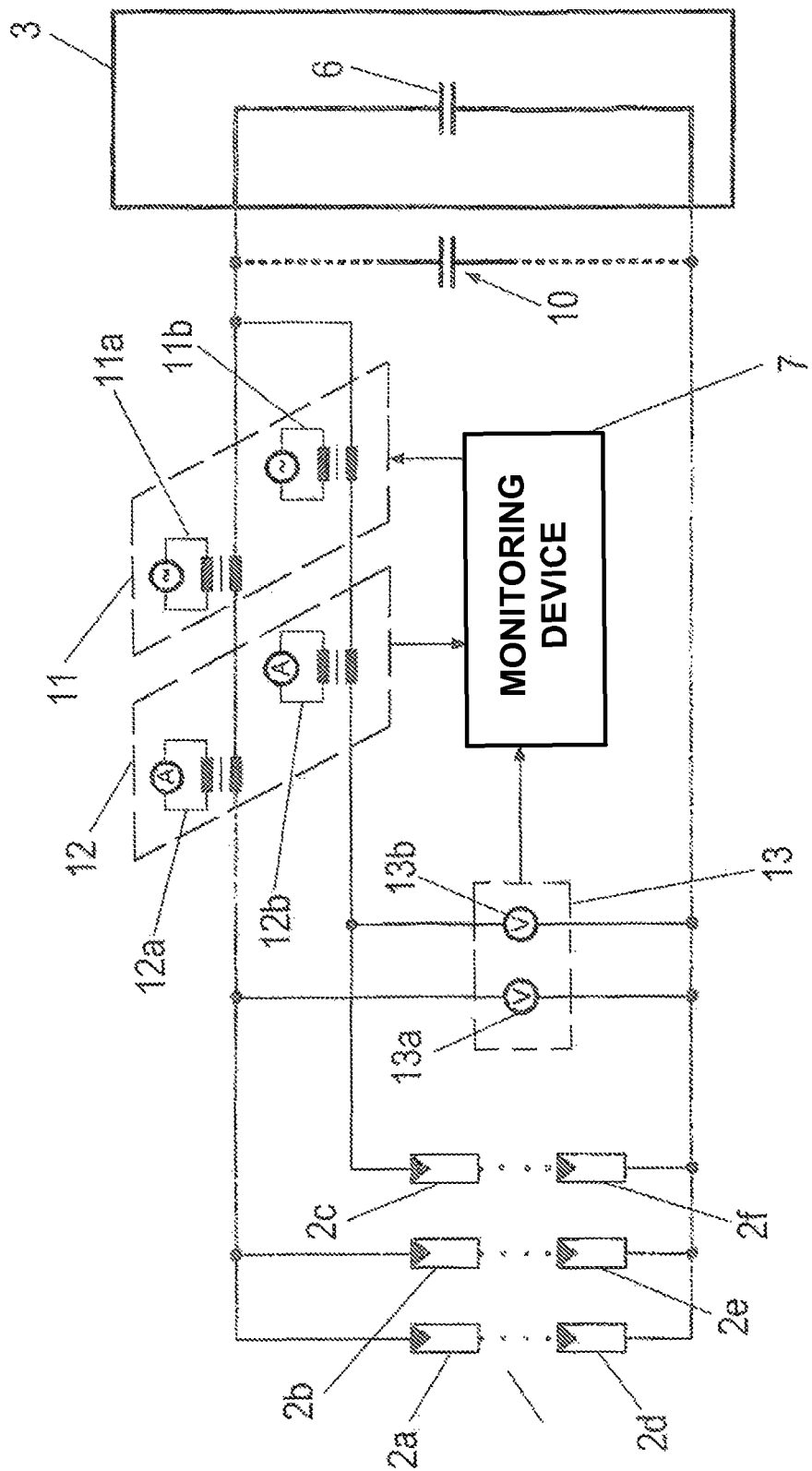
FIG. 4 shows a third embodiment of the disclosure in the form of a simplified electrical circuit diagram.

In the example embodiment shown in FIG. 4, a photovoltaic generator 2 is subdivided into two groups. A first group is formed by two parallel-connected strings having the photovoltaic modules 2a, 2d and 2b, 2e. A further string formed from the photovoltaic modules 2c, 2f constitutes a second group. A transformer 11a as coupling-in means and a current transformer 12a and a voltmeter 13a as coupling-out means are assigned to the first group. A further transformer 11b, a further current transformer 12b and a further voltmeter 13b are assigned to the second group as the coupling-in and coupling-out means, respectively.

In other words, the photovoltaic generator 2 is subdivided in this case in such a manner that a group has a number of strings 2a, 2d/2b, 2e connected in parallel.

The reduced outlay on hardware is advantageous in this variant as well. In this case, the coupling-in means 11, for example the transformer 11a, is configured in such a manner that it can transmit a required coupling-in power for the corresponding group.

Figure 5:
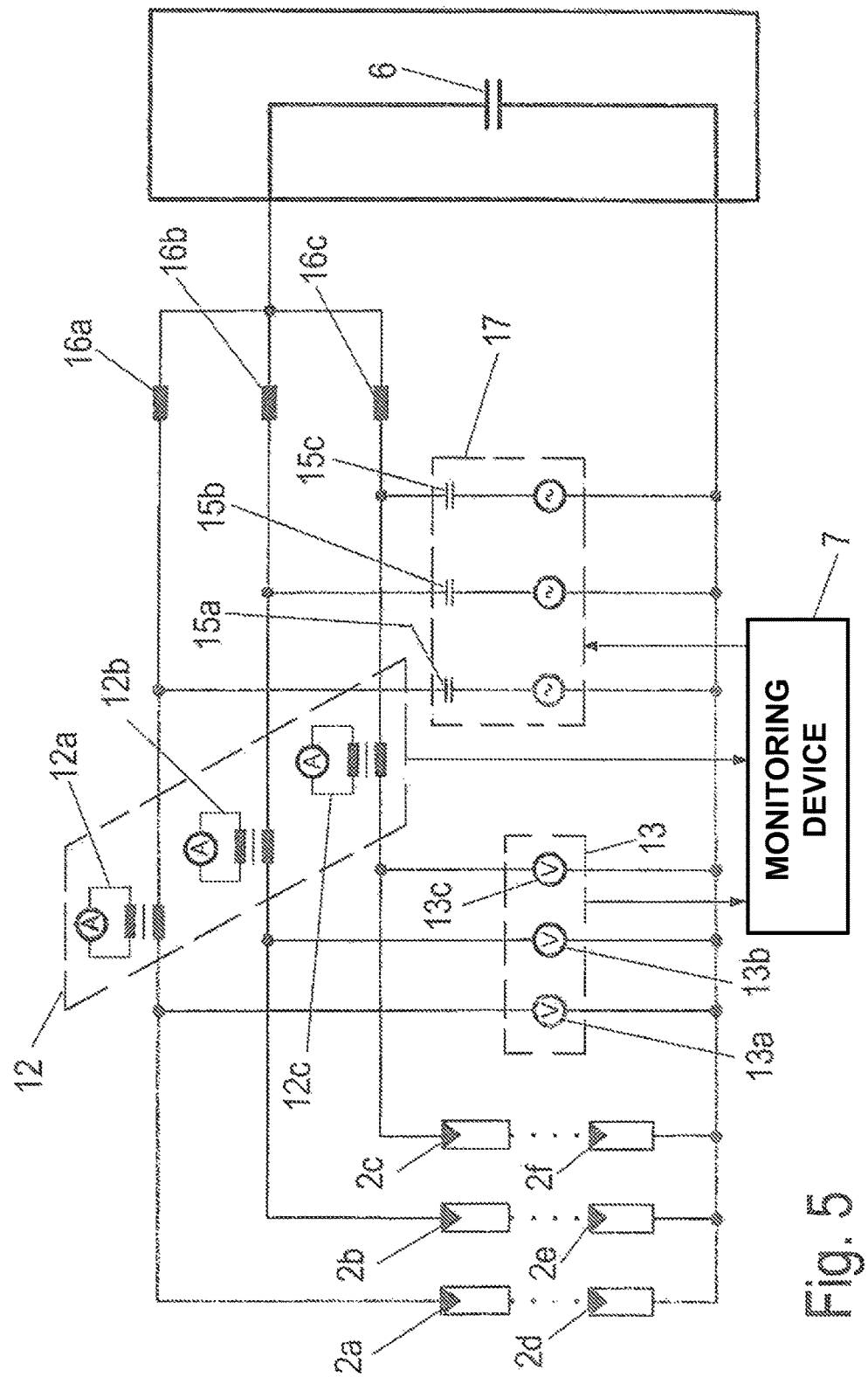
FIG. 5 shows a fourth embodiment of the disclosure in the form of a simplified electrical circuit diagram.

FIG. 5 shows another embodiment of a photovoltaic system in which the photovoltaic generator 2 is divided into three groups, here formed by three strings, like in FIG. 2.

In contrast to FIG. 2, a test signal is not coupled in using a transformer but rather by means of capacitive coupling-in via a coupling capacitance 17, for example via coupling-in means 15a, 15b and 15c. In order to minimize mutual influence of the individual measuring circuits, blocking inductances 16a, 16b and 16c are provided. The blocking inductances perform the task of separating the individual measuring circuits in terms of alternating current, and are each connected in series with respective current transformers 12a, 12b, 12c. A previously required AC equivalent capacitance (cf. FIGS. 2 to 4, reference symbol 10) can be omitted since the AC circuit is closed via the coupling-in means 15a, 15b and 15c of the coupling capacitance 17.

Figure 6:
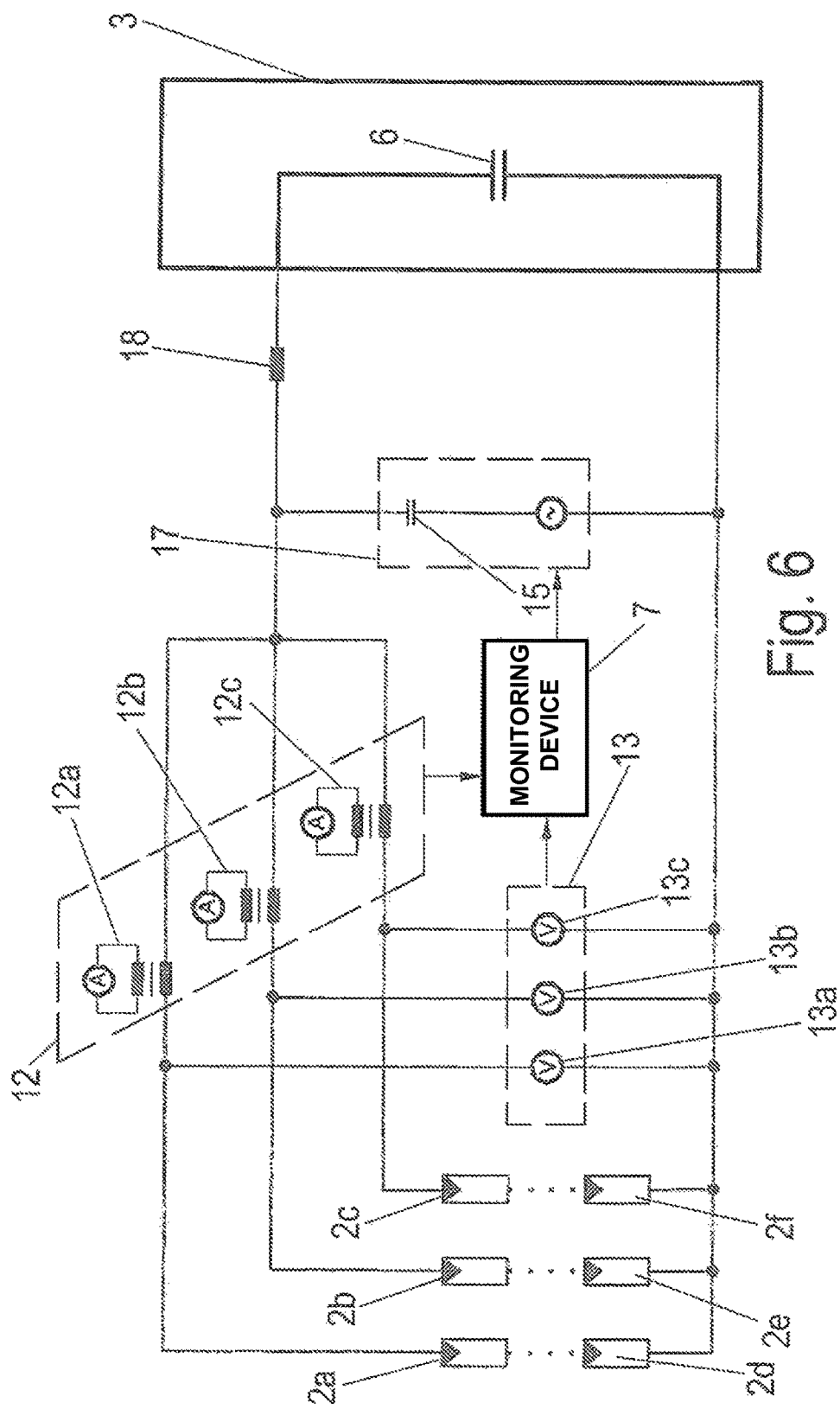
FIG. 6 shows a fifth embodiment of the disclosure in the form of a simplified electrical circuit diagram.

FIG. 6 shows an arrangement corresponding largely to the arrangement shown in FIG. 5. Unlike in FIG. 5, however, a test signal is coupled in jointly via capacitive coupling-in using a common coupling capacitance 17 with a coupling-in means 15.

A blocking inductance 18 is used for the required separation (already explained) of the measuring circuits. The blocking inductance 18 is inserted in the connecting line between the inverter 3 and a branch to the individual measuring circuits, the coupling capacitance 17 being connected for coupling-in between the blocking inductance 18 and the branch to the individual measuring circuits.

Figure 7:
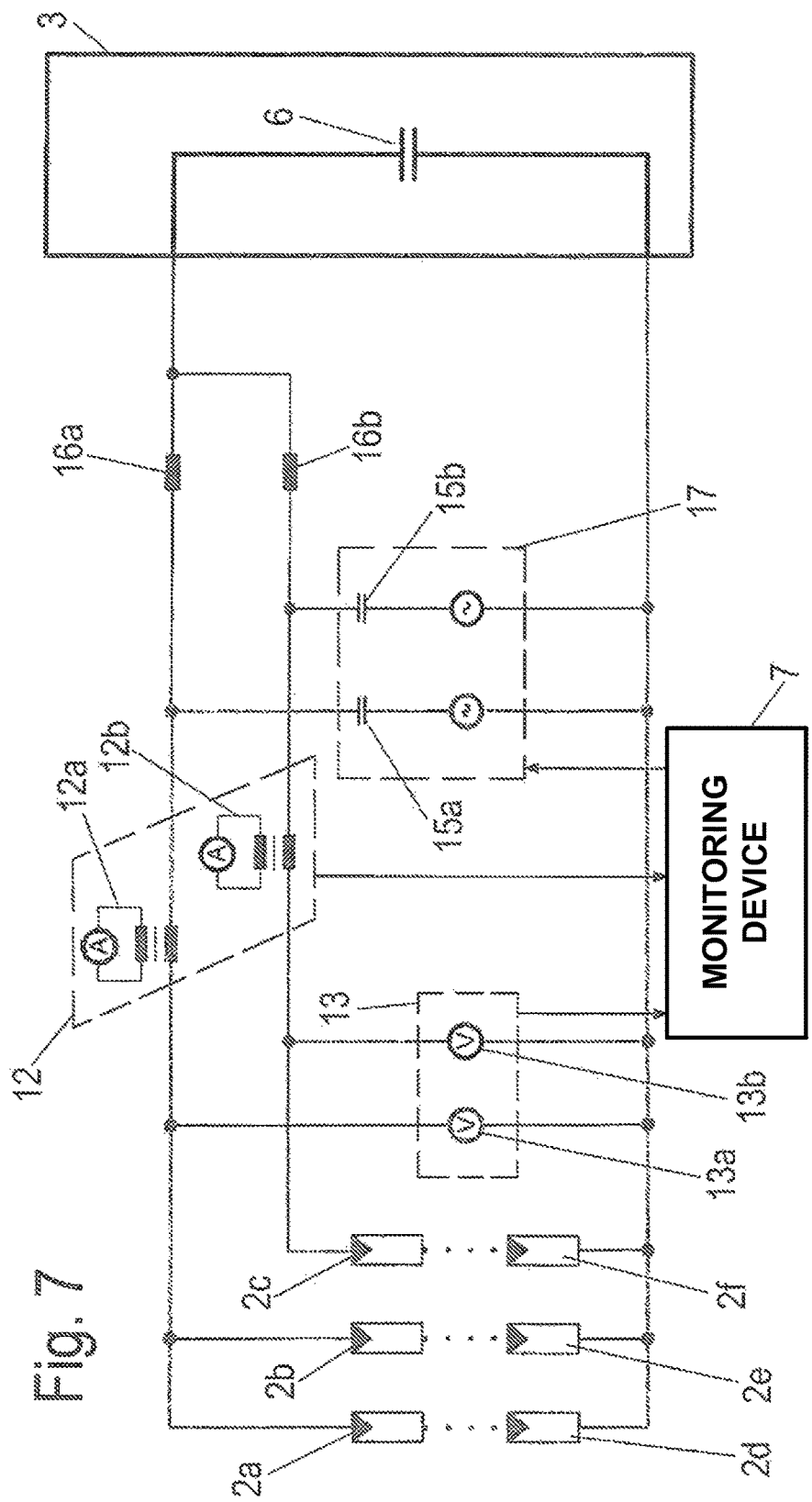
FIG. 7 shows a sixth embodiment of the disclosure in the form of a simplified electrical circuit diagram.

FIG. 7 shows an arrangement which again corresponds largely to the arrangement shown in FIG. 5. However, unlike in FIG. 5, a plurality of strings (here the strings 2a, 2d and 2b, 2e) are again combined here to form a group. In this case, it is clear that the dimensioning and design of the current transformer 12a as a coupling-out means, of the blocking inductance 16a and of the coupling-in means 15a or the coupling capacitance 17 must be adapted to the corresponding requirements.

Figure 8:
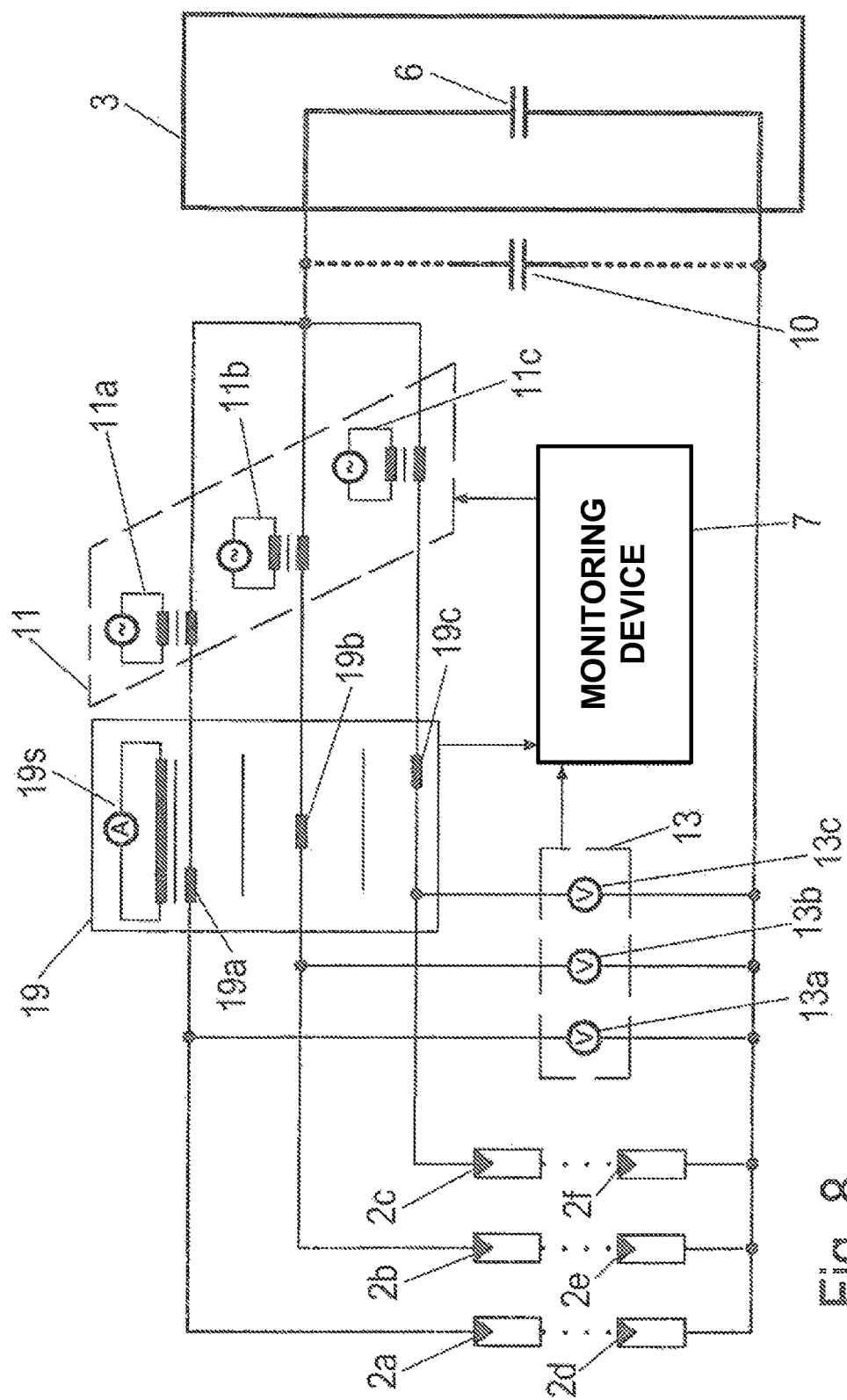
FIG. 8 shows a seventh embodiment of the disclosure in the form of a simplified electrical circuit diagram.

FIG. 8 shows an embodiment which corresponds substantially to the embodiment already shown in FIG. 2. In contrast to the arrangement shown in FIG. 2, the coupling-out means for detecting the current (cf. FIG. 2, 12, 12a, 12b, 12c) are combined in FIG. 8 to form a superordinate single coupling-out means 19. For example, this may be effected by means of a transformer having a secondary winding 19s and a number of primary windings 19a, 19b and 19c corresponding to the number of measuring circuits. In contrast, the voltmeters 13a, 13b, 13c as coupling-out means for detecting the voltage are configured separately for each group.

Figure 9:
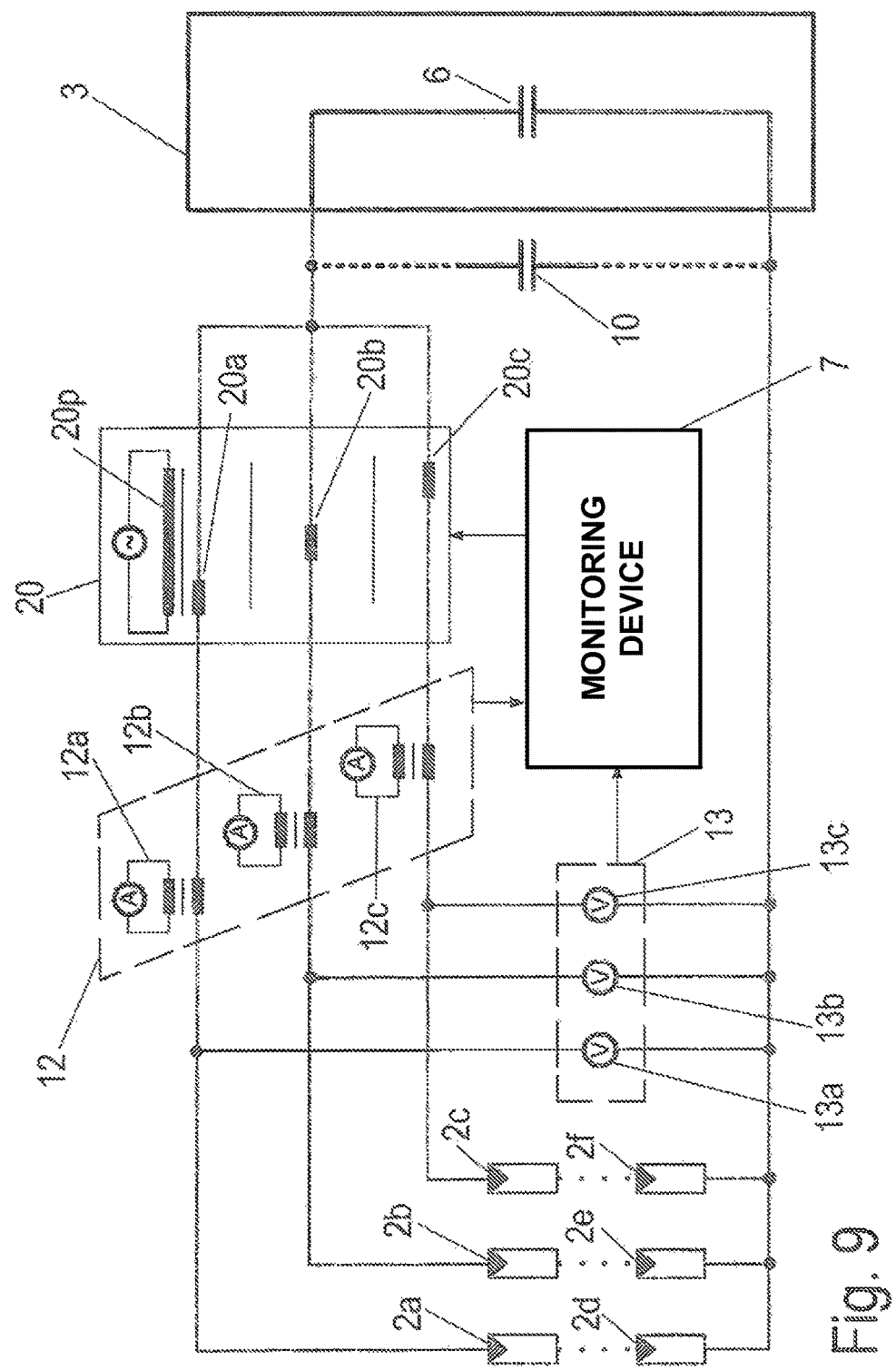
FIG. 9 shows an eighth embodiment of the disclosure in the form of a simplified electrical circuit diagram.

FIG. 9 shows an embodiment which corresponds largely to the embodiment shown in FIG. 2. In contrast to the arrangement shown in FIG. 2, the coupling-in means (cf. FIGS. 2, 11, 11a, 11b and 11c) are combined in FIG. 8 to form one coupling-in means 20. This may be effected, for example, by means of a transformer having a primary winding 20p and a number of secondary windings 20a, 20b and 20c corresponding to the number of measuring circuits.

Finally, FIG. 10 illustrates an embodiment in which all photovoltaic modules 2a to 2f are arranged in series in the form of a string. Subdivision into separately monitored groups is achieved in this example embodiment by arranging the voltage measuring device 13 as the coupling-out means. The voltage measuring device 13 is connected in such a manner that a respective voltmeter 13a, 13b, 13c is assigned to a partial string formed by the photovoltaic modules 2a-2d, 2b-2e and 2c-2f and detects its respective voltage. The groups are therefore formed by the partial strings here.

A current transformer 12 is provided as a further common coupling-out means. The coupling-in means is also common to all groups as a transformer 11. In this case, the transformer 11 and the current transformer 12 are connected in series in a connecting line between the inverter 3 and the string formed from the photovoltaic modules 2a-2f.

In all examples shown, it is additionally possible to also monitor the coupling-out means for the presence of a high-frequency signal independently of the feeding-in of the test signal. An arc, for example arising at an inadequate electrical contact, feeds a high-frequency signal into the current path on account of oscillations forming in its plasma. Therefore, the presence of a high-frequency signal which is not attributed to the feeding-in of the test signal can indicate an arc which has occurred inside a group. In this case, it is possible, on the one hand, to detect an arc even while a test signal is fed in, for example if a high-frequency signal is detected in an intensity above the intensity which can be expected on the basis of a test signal fed in. On the other hand, it is conceivable to suspend the feeding-in of the test signal in predetermined periods, for example periodically, and to monitor the occurrence of a high-frequency signal inside the photovoltaic system in these periods using the coupling-out means.

The disclosure is not restricted to the exemplary embodiments described which can be modified in multiple ways. In particular, it is possible to implement the features mentioned in combinations other than those mentioned.

The disclosure can thus also be applied to individual photovoltaic modules, an individual photovoltaic module with a number of photovoltaic cells then being able to be subdivided into groups (of cells). The present disclosure can likewise be applied to these groups.

The invention claimed is:

1. A device for monitoring a photovoltaic system to detect an occurrence of events impairing normal operation of the photovoltaic system, wherein the photovoltaic system comprises a photovoltaic generator comprising a first group of photovoltaic modules and a second group of photovoltaic modules being different from the first group, the device comprising:
   a first and a second pair of coupling means, both pairs comprising signal coupling-in means for coupling a test signal into the photovoltaic generator, and a signal coupling-out means for coupling out a response signal from the photovoltaic generator, the first pair of coupling means configured to selectively detect the occurrence of the events in the first group of photovoltaic modules, and the second pair of coupling means configured to selectively detect the occurrence of the events in the second group of photovoltaic modules,
   wherein a DC current of the first group of photovoltaic modules flows through the signal coupling-in means of the first pair of coupling means, and a DC current of the second group of photovoltaic modules flows through the signal coupling-in means of the second pair of coupling means.

2. The device as claimed in claim 1, wherein the signal coupling-in means of the first pair of coupling means are identical to the signal coupling-in means of the second pair of coupling means.

3. The device as claimed in claim 1, wherein the signal coupling-out means of the first pair of coupling means are identical to the signal coupling-out means of the second pair of coupling means.

4. The device as claimed in claim 1, wherein the signal coupling-out means comprises a current transformer.

5. The device as claimed in claim 4, wherein the current transformer comprises a non-saturating inductance in a current path of the photovoltaic generator.

6. The device as claimed in claim 1, wherein the signal coupling-in means comprises a transformer.

7. The device as claimed in claim 1, wherein the signal coupling-out means comprises a voltage measuring device.

8. The device as claimed in claim 7, the first and second groups of photovoltaic modules being connected in series, and the voltage measuring device comprising voltmeters assigned to different ones of the first and second groups.

9. The device as claimed in claim 1, the signal coupling-in means comprising a capacitive coupling-in element.

10. The device as claimed in claim 1, further comprising a monitoring device connected to the first and second pairs of coupling means and configured to generate the test signal and configured to evaluate the response signal, wherein the signals from the first and second pairs of coupling means are evaluated separately.

11. The device as claimed in claim 10, wherein the monitoring device is configured to generate a warning signal corresponding to a respective one pair of coupling means, if an aging-specific property of the group of photovoltaic modules assigned to the respective pair of coupling means exceeds a predetermined value.

12. A method of monitoring a photovoltaic system with a number of at least two or more photovoltaic modules to detect the occurrence of events impairing normal operation of the photovoltaic system, wherein the at least two or more photovoltaic modules are divided into at least two or more groups, each of the groups being monitored for the occurrence of an event impairing the normal operation of the photovoltaic system, comprising:
 exciting the photovoltaic system with at least one electrical test signal coupled into the photovoltaic system using a coupling-in means for each of the at least two groups, respectively;
 coupling out selectively at least one excitation response signal from the photovoltaic system using a coupling-out means for each of the at least two groups, respectively; and
 evaluating the excitation response signals from each of the at least two groups of the photovoltaic system to detect the occurrence of at least one event impairing the normal operation of the photovoltaic system for each of the at least two groups of photovoltaic modules.

13. The method as claimed in claim 12, wherein one or both of exciting the photovoltaic system and coupling out at least one excitation response signal are carried out separately for each group.

14. The method as claimed in claim 12, wherein at least one of the groups or a plurality of the groups comprises two or more photovoltaic modules connected in series and/or in parallel.

15. The method as claimed in claim 12, wherein at least one of the coupling-in of the test signal and the coupling-out of the signal response is carried out in a galvanically isolated manner.

16. The method as claimed in claim 12, wherein the evaluation of the excitation response signal is applied to detect an arc occurring inside the photovoltaic system.

* * * * *